(12) United States Patent
Pahkala et al.

(10) Patent No.: US 11,206,027 B2
(45) Date of Patent: Dec. 21, 2021

(54) DPLL RESTART WITHOUT FREQUENCY OVERSHOOT

(71) Applicant: Texas Instruments Incorporated, Dallas, TX (US)

(72) Inventors: Janne Matias Pahkala, Oulu (FI); Ari Kalevi Väänänen, Oulu (FI)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 13 days.

(21) Appl. No.: 16/900,208

(22) Filed: Jun. 12, 2020

(65) Prior Publication Data

US 2021/0111727 A1 Apr. 15, 2021

Related U.S. Application Data

(60) Provisional application No. 62/914,346, filed on Oct. 11, 2019.

(51) Int. Cl.
| | |
|---|---|
| *H03L 7/099* | (2006.01) |
| *H03L 7/08* | (2006.01) |
| *H03L 7/097* | (2006.01) |
| *H02M 3/04* | (2006.01) |
| *H03L 7/095* | (2006.01) |

(Continued)

(52) U.S. Cl.
CPC .............. *H03L 7/099* (2013.01); *H02M 1/08* (2013.01); *H02M 3/04* (2013.01); *H03L 7/08* (2013.01); *H03L 7/081* (2013.01); *H03L 7/0802* (2013.01); *H03L 7/083* (2013.01); *H03L 7/0805* (2013.01); *H03L 7/0814* (2013.01); *H03L 7/093* (2013.01); *H03L 7/095* (2013.01); *H03L 7/097* (2013.01); *H03L 7/0991* (2013.01); *H03L 7/10* (2013.01); *H03L 7/14* (2013.01)

(58) Field of Classification Search
CPC ......... H03L 7/099; H03L 7/081; H03L 7/093; H03L 7/08; H03L 7/0802; H03L 7/0805; H03L 7/0807; H03L 7/083; H03L 7/085; H03L 7/095; H03L 7/097; H03L 7/10; H03L 7/14; H03L 7/16; H03L 7/18; H03L 7/20; H03L 2207/50; H03L 7/091; H03L 7/07; H03L 7/089; H03L 7/0991; H03L 7/0992; H03L 7/891; H03L 7/0814; H03L 7/1976; H03L 7/087; H02M 3/04; H02M 1/08

See application file for complete search history.

(56) References Cited

U.S. PATENT DOCUMENTS

| | | | | |
|---|---|---|---|---|
| 9,716,507 | B1* | 7/2017 | Nummer | H03L 7/0805 |
| 2012/0057655 | A1* | 3/2012 | Marsili | H04L 27/361 |
| | | | | 375/300 |
| 2015/0222276 | A1* | 8/2015 | Milijevic | H03L 7/0991 |
| | | | | 327/147 |

* cited by examiner

*Primary Examiner* — John W Poos
*Assistant Examiner* — Alex W Lam
(74) *Attorney, Agent, or Firm* — Mark Allen Valetti; Charles A. Brill; Frank D. Cimino

(57) ABSTRACT

A system includes a digital phase-locked loop (DPLL) having a loop filter and a digitally-controlled oscillator (DCO). The system also includes a clock generator coupled to an output of the DPLL, and a plurality of clock domains coupled to the clock generator. The DPLL is configured to transition between a low power mode and a normal mode, wherein the loop filter is configured to maintain its value when the DPLL transitions from the normal mode to the low power mode. The DCO is configured to output a DCO clock signal based on the maintained loop filter value when the DPLL transitions from the low power mode to the normal mode.

20 Claims, 10 Drawing Sheets

(51) Int. Cl.
*H02M 1/08* (2006.01)
*H03L 7/14* (2006.01)
*H03L 7/083* (2006.01)
*H03L 7/10* (2006.01)
*H03L 7/081* (2006.01)
*H03L 7/093* (2006.01)

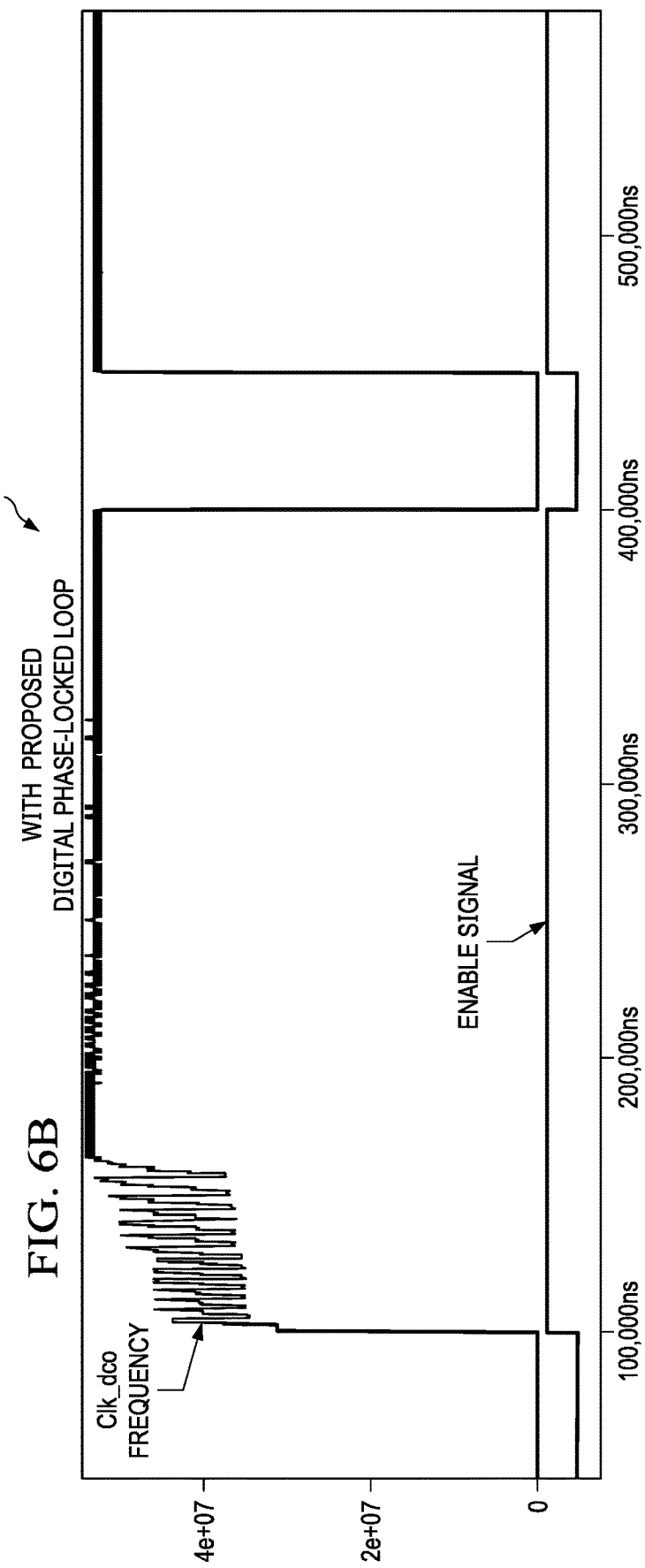

DPLL RESTART WITHOUT FREQUENCY OVERSHOOT

CROSS-REFERENCE TO RELATED APPLICATIONS

This application claims priority to U.S. Provisional Application No. 62/914,346, filed Oct. 11, 2019, which is hereby incorporated by reference.

BACKGROUND

Phase-locked loop (PLLs) are used to provide an output signal with a phase related to the phase of an input signal. The output signal of a PLL is often used by a clock generator to generate one or more clock signals for use by different clock domains. One example of a clock domain is a switching converter that uses a clock signal to control switching operations. In some clock domain scenarios, as in the case of a switching converter, a clock signal is not continuously needed (e.g., during a light load condition). One conventional technique to reduce power consumption in an electronic circuit involves turning components off when not needed. However, for certain clock domains, such as a switching converter, the speed at which a circuit (e.g., a PLL) can be turned back on is problematic.

In an example automotive scenario, multiphase switching converter (e.g., buck converter) integrated circuits (ICs) operate under a high frequency clock to generate interleaved switching so as to avoid electromagnetic interference (EMI) and minimize output voltage (VOUR) ripple. This is achieved by generating a phase shift to the switch clocks. The phase shifting needs to be divided equally between the buck converters and this can be done digitally by dividing the high frequency clock output from the PLL to generate phase shifted switch clocks. Also, the switching needs to be synchronized to an external clock provided by the system to optimize the EMI. In addition, low power modes (e.g., an automatic phase shedding mode, a pulse frequency modulation (PFM), etc.) are often required to optimize the current consumption and efficiency of the switching converter. In the low power modes, part of the switching converter (e.g., certain analog blocks) is turned off or are transitioned to low current mode to minimize the current consumption. It can be beneficial, in low power mode, to turn off the high frequency clock when it is not needed, because it has relatively high current consumption. However, when the switching converter transitions from the low power mode to a normal mode (e.g., a PWM mode), the clock needs to be supplied to the switching converter with the correct frequency and without long delays to prevent the incorrect behavior of the switching converter. This means that the source clock for the clock divider needs to restart to the correct frequency without significant delay (some combinational logic delay is acceptable).

Digital PLLs (DPLLs) have a long start up time if started from a loop filter reset value. While a DPLL can be started from a predetermined loop filter value, the phase detector of the DPLL would initially measure large phase error between the reference clock and the feedback clock when the DPLL is re-enabled, resulting in the DPLL output clock frequency having too much undershoot or overshoot. Such inaccuracies in the DPLL output clock frequency cause timing violations for the logic (e.g., a clock generator) that uses the DPLL output clock (e.g., a timing violation for the switching converter clock specifications).

SUMMARY

In accordance with at least one example of the disclosure, a system comprises a digital phase-locked loop (DPLL) having a loop filter and a digitally-controlled oscillator (DCO). The system also includes a clock generator coupled to an output of the DPLL. The system also includes a plurality of clock domains coupled to the clock generator. The DPLL is configured to transition between a low power mode and a normal mode, wherein the loop filter is configured to maintain its value when the DPLL transitions from the normal mode to the low power mode. The DCO is configured to output a DCO clock signal based on the maintained loop filter value when the DPLL transitions from the low power mode to the normal mode.

In accordance with at least one example of the disclosure, a DPLL circuit comprises a reference clock node, and an output node. The DPLL circuit also comprises a phase-frequency digital converter coupled to the reference clock node, and a loop filter coupled to an output of the phase-frequency digital converter. The DPLL circuit also comprises a DCO coupled to an output of the loop filter, and a control circuit coupled to the phase-frequency digital converter and the DCO. The control circuit is configured to enable and disable the phase-frequency digital converter and the DCO in response to transitions between a normal mode and a low power mode of the DPLL circuit. The DCO is configured to output a DCO clock signal based on a value maintained by the loop filter in response to the phase-frequency digital converter and the DCO being enabled for a first interval corresponding to the normal mode and then being disabled for a second interval corresponding to the low power mode.

In accordance with at least one example of the disclosure, an integrated circuit comprises a DPLL having a reference clock node and an output node. The DPLL also comprises a phase-frequency digital converter coupled to the reference clock node, and a loop filter coupled to an output of the phase-frequency digital converter. The DPLL also comprises a DCO coupled to an output of the loop filter. The DCO is configured to output a clock signal to the output node based on a value maintained by the loop filter in response to the DPLL being enabled in a normal mode, disabled in a low power mode, and enabled again in a subsequent normal mode.

BRIEF DESCRIPTION OF THE DRAWINGS

For a detailed description of various examples, reference will now be made to the accompanying drawings in which:

FIG. 6B is a timing diagram showing waveforms in accordance with an example embodiment;

DETAILED DESCRIPTION

Disclosed herein is digital phase-locked loop topology with mode control and a loop that is configured to restart without frequency overshoot. In the proposed embodiments, the DPLL supports a normal mode and a low power mode. In the normal mode, components (preferably, all components) of the loop (e.g., a phase-frequency digital converter, a loop filter, and a digitally-controlled oscillator or "DCO") are enabled to provide a DCO clock signal (Clk_dco) based on a reference clock (Clk_ref). In the low power mode, the loop filter maintains its value, while other components of the loop (e.g., the phase-frequency digital converter and DCO) are powered down. When the DPLL is started again, Clk_dco is available and is based on the value maintained by the loop filter until the phase-frequency digital converter and related feedback operations are enabled after the rising edge of Clk_ref. In this manner, the proposed DPLL supports a low power mode, while also ensuring Clk_dco is available upon restart.

As an example, the proposed DPLL can be used in a system with a clock generator coupled to an output of the DPLL. The system also includes a plurality of clock domains (e.g., switching converters) coupled to the clock generator. The DPLL is configured to transition between a low power mode and a normal mode, where the loop filter is configured to maintain its value when the DPLL transitions from the normal mode to the low power mode, and where the DCO is configured to output a DCO clock signal based on the maintained loop filter value when the DPLL transitions from the low power mode to the normal mode. The immediate availability of an accurate output from the DPLL upon restart is important in various scenarios to ensure compliance with target performance of clock domains reliant on the DPLL output. To provide a better understanding, various DPLL topology options and related systems or scenarios are described using the figures as follows.

Figure 1:
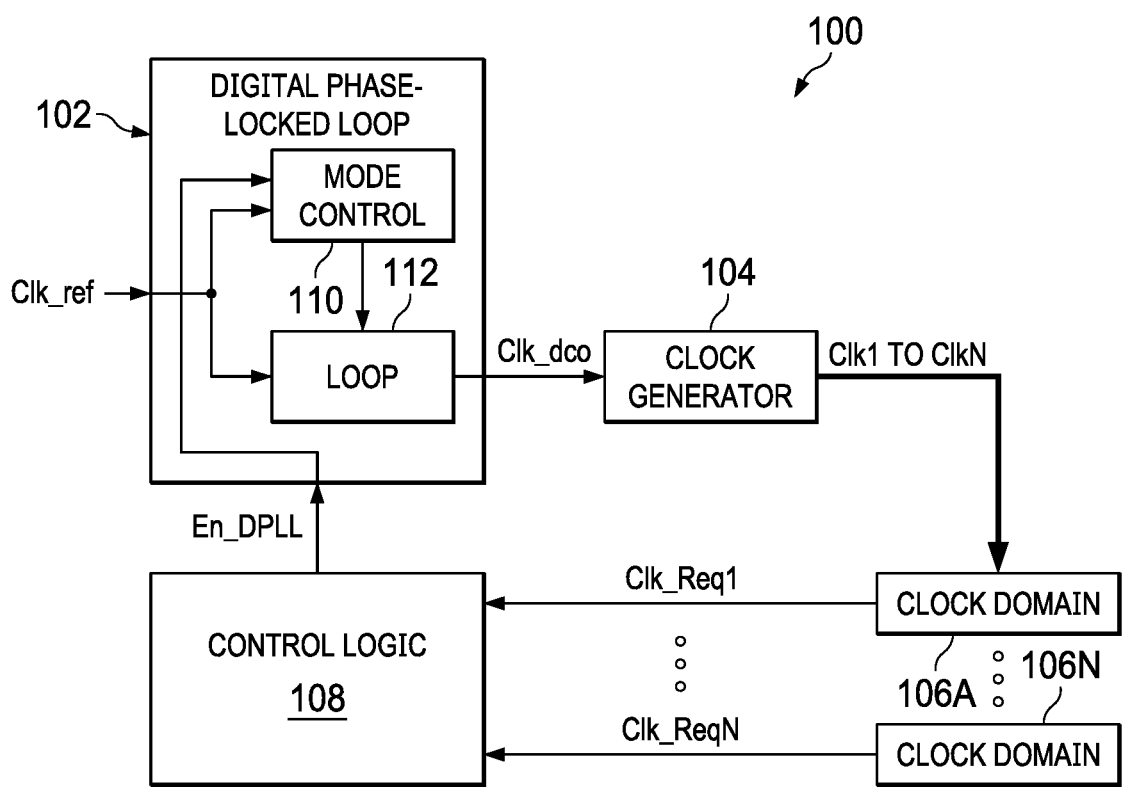
FIG. 1 is a block diagram showing a system in accordance with an example embodiment.

FIG. 1 is a block diagram showing a system 100 in accordance with an example embodiment. In different examples, the system 100 corresponds to an automotive system, consumer electronics system, industrial electronics system, or other system with a power management integrated circuit (PMIC) that includes a DPLL as described herein for internal clocking operations. In some examples, the PMIC is used to clock different clock domains of the system 100 such as buck converters, microcontrollers, sensors, transceivers, processors, or other clock domains. As shown, the system 100 includes a DPLL 102 configured to provide a DCO clock signal (Clk_dco) based on a reference clock signal (Clk_ref). In the system 100, Clk_dco is provided to a clock generator 104 configured to generate a plurality of clock signals (Clk1 to ClkN) based on Clk_dco, where Clk1 to ClkN are provided to clock domains 106A-106N. In some example embodiments, the clock domains 106A-106N correspond to switching converters (e.g., buck converters) or other circuitry with different modes of operations. As needed, each of the clock domains 106A-106N is able to assert a clock request signal (Clk_Req1 to Clk_ReqN) to control logic 108. The control logic 108 is coupled to the DPLL 102 and provides an enable signal (En_DPLL) to selectively enable or disable the DPLL 102.

In the system 100, the DPLL 102 includes a mode control circuit 110 and a loop 112 configured to receive Clk_ref. More details regarding the DPLL is provided below in relationship to FIG. 5. The mode control circuit 110 is also configured to receive En_DPLL from the control logic 108. In some example embodiments, the mode control circuit 110 supports a normal mode and a low power mode. In the normal mode, all components of the loop 112 (e.g., a phase-frequency digital converter, a loop filter, a DCO) are enabled. In the low power mode, a loop filter of the loop 112 maintains its value and other components of the loop 112 (e.g., a phase-frequency digital converter and a DCO) are disabled or turned off. Upon restart, the loop 112 is able to output Clk_dco immediately based on the value maintained by the loop filter during the low power mode. Various other features of the DPLL are discussed later.

Figure 2:
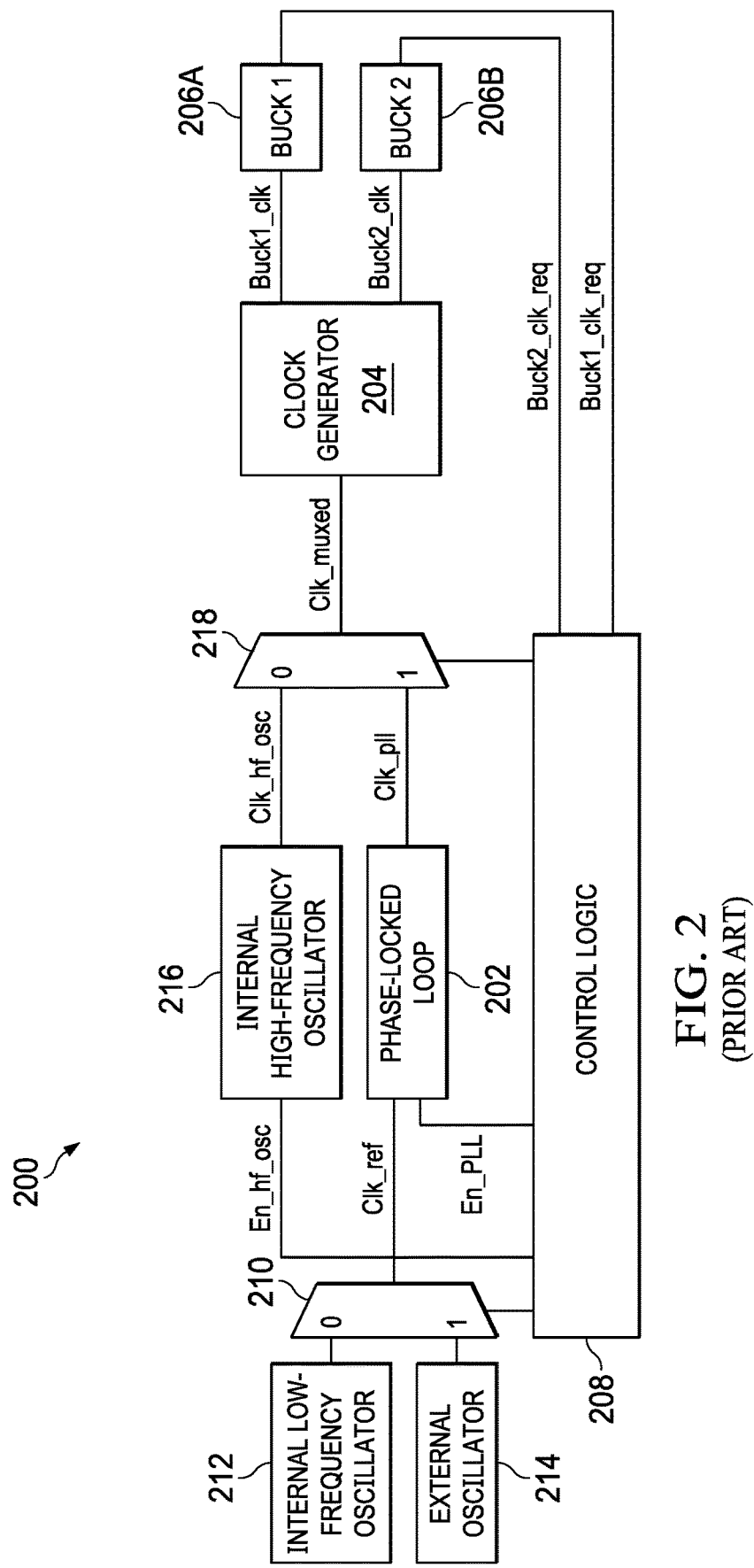
FIG. 2 is a block diagram showing a system in accordance with a conventional approach.

FIG. 2 is a block diagram showing a system 200 in accordance with a conventional approach. In the system 200, a phase-locked loop (PLL) 202 is configured to provide an output signal (Clk_pll) based on a reference clock (Clk_ref). As shown, Clk_ref corresponds to a signal from an internal low-frequency (LF) oscillator 212 (e.g., 1.1 MHz) or from an external oscillator depending on which of these signals is passed by a multiplexer 210 in response to control logic 208. Besides controlling the multiplexer 210, the control logic 208 also provides an enable signal (En_hf_osc) to an internal high-frequency (HF) oscillator 216 (e.g., 52.8 MHz, or 48 times the low frequency), which provides a clock signal (Clk_hf_osc). As shown, Clk_hf_osc and Clk_pll are inputs to a multiplexer 218, where the control signal for the multiplexer 218 is provided by the control logic 208. The output of the multiplexer 218 is labeled Clk_muxed and is provided to a clock generator 204 configured to generate clock signals Buck1_clk and Buck2_clk based on Clk_muxed. As shown, Buck1_clk is provided to a first buck converter 206A to support at least one mode of the first buck converter 206A. Also, Buck2_clk is provided to a second buck converter 206B to support at least one mode of the second buck converter 206B. During operations of the first buck converter 206A and the second buck converter 206B, each may selectively transition to a low power mode depending on a load condition or a schedule.

As needed, each of the first buck converter 206A and the second buck converter 206B is able to assert a respective request signal (Buck1_clk_req and Buck2_clk_req) to the control logic 208. In response, the control logic 208 enables the PLL 202 using En_PLL, which results in the Clk_pll signal. Using conventional technology (such as illustrated by system 200), the PLL 202 cannot be disabled because the restart time takes too long, resulting in inefficiency in low power modes. One option to improve the restart time for low power modes would be to use an internal HF oscillator (e.g., the HF oscillator 216) with a fast restart time. However, this internal HF oscillator cannot be synchronized to an external oscillator. Another option involves adding an external oscillator and additional logic for clock selection (e.g., to select between the PLL clock and an external oscillator clock as needed to) to support clock synchronization to an external oscillator and transitions from a low power mode, but this option would undesirably increase cost and size of the circuit.

Figure 3:
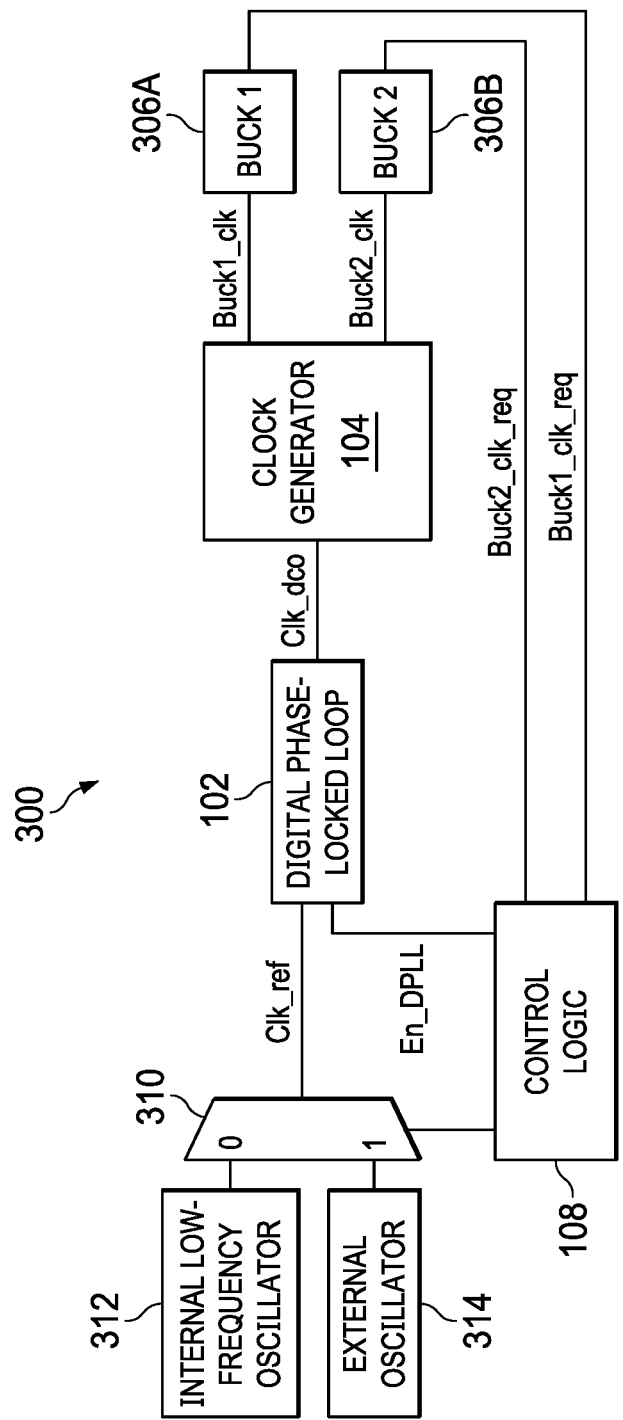
FIG. 3 is a block diagram showing a system in accordance with an example embodiment.

FIG. 3 is a block diagram showing a system 300 in accordance with an example embodiment. Similar to system 100, DPLL 102 of system 300 provides Clk_dco based on a reference clock (Clk_ref). In the example of FIG. 3, Clk_ref corresponds to a signal from an internal low-frequency (LF) oscillator 312 (e.g., 1.1 MHz) or from an external oscillator depending on which of these signals is selected by control logic 108 via multiplexer 310. Besides controlling the multiplexer 310, the control logic 108 also provides an enable signal (En_DPLL) to DPLL 102. When enabled, the DPLL 102 outputs Clk_dco (based on Clk_ref) to a clock generator 104. Clock generator 104 is configured to generate a plurality of clock signals, such as Buck1_clk and Buck2_clk, based on Clk_dco. As shown, Buck1_clk is provided to a first buck converter 306A to support at least one mode of the first buck converter 306A. Also, Buck2_clk is provided to the second buck converter 306B to support at least one mode of the second buck converter 306B. During operations of the first buck converter 306A and the second buck converter 306B, each may selectively transition to a low power mode depending on a load condition or a schedule.

As needed (such as when a buck converter is transitioning from a low power mode to an operating mode), each of the first buck converter 306A and the second buck converter 306B is able to request a clocking signal by asserting a respective request signal (Buck1_clk_req and Buck2_clk_req) to the control logic 108. In response, the control logic 108 enables the DPLL 102 (using the En_DPLL signal) to supply the appropriate clock signal, via clock generator 104, to the requesting buck converter. In accordance with an example embodiment, the DPLL 102 is able to restart and provide Clk_dco immediately based on a value maintained by a loop filter included in DPLL 102 (not shown in FIG. 3 but included in loop 112 in FIG. 1) during a low power mode. System 300 of an example embodiment avoids the long start-up time after a low power mode and avoids the additional components (e.g., an external oscillator and additional clock selection logic) of the conventional technology (such as the circuit shown in FIG. 2), which would make the circuit design bulky.

Figure 4:
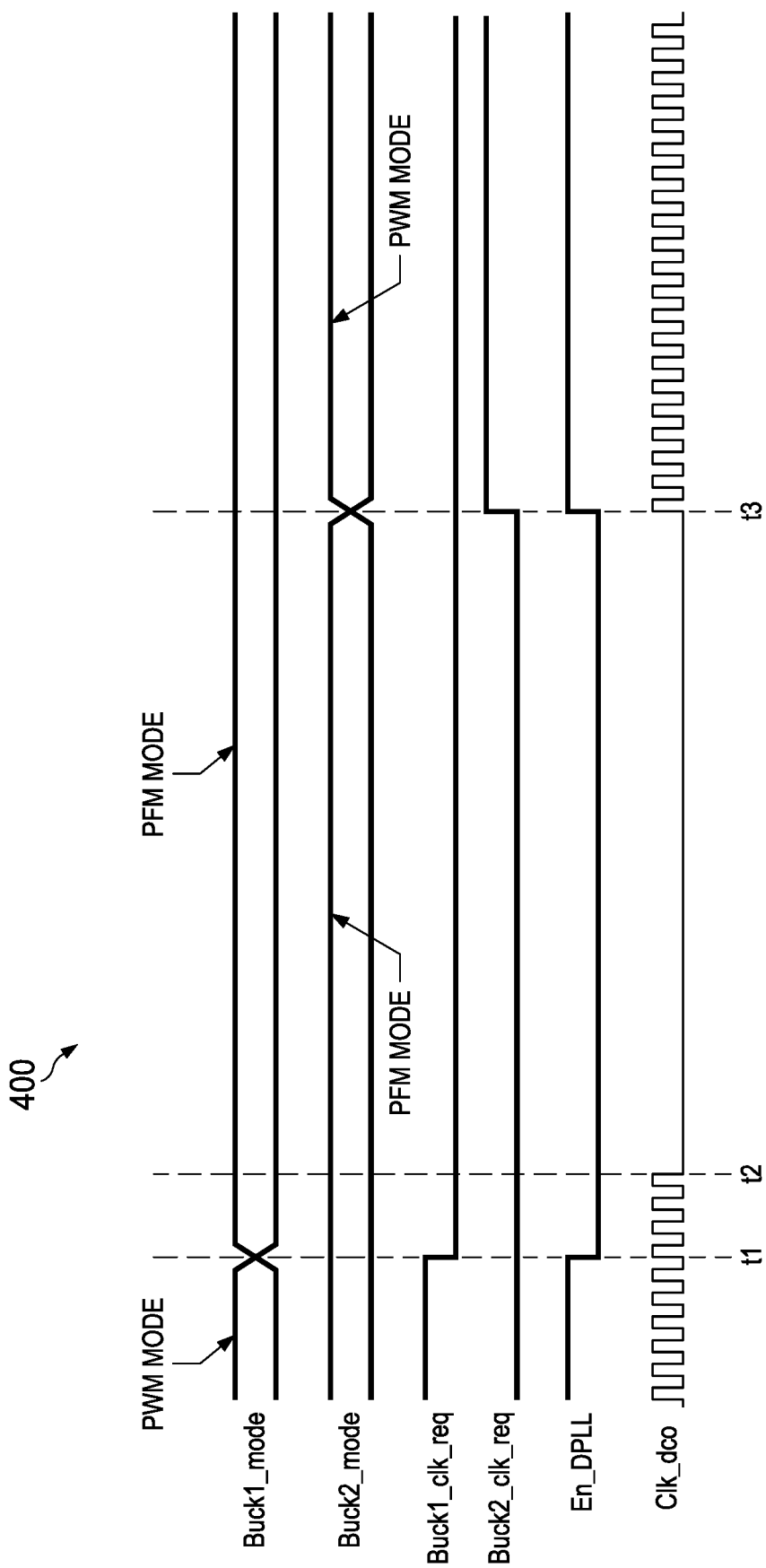
FIG. 4 is a timing diagram showing waveforms for the system of FIG. 3 in accordance with an example embodiment.

FIG. 4 is a timing diagram 400 showing waveforms related to the system 300 of FIG. 3 in accordance with an example embodiment. In the timing diagram 400, Buck1_mode waveforms (related to modes of the first buck converter 306A), Buck2_mode waveforms (related to modes of the first buck converter 306B), a Buck1_clk_req waveform, a Buck2_clk_req waveform, an En_DPLL waveform, and a Clk_dco waveform are represented. More specifically, the Buck1_mode waveforms include a pulse width modulation (PWM) mode (normal mode) signal and a pulse frequency modulation (PFM) mode (low power mode) signal. Also, the Buck2_mode waveforms include a PWM mode signal and a PFM mode signal.

When the PWM mode signal related to the first buck converter 306A is de-asserted at t1, the PFM mode signal related to the first buck converter 306A is asserted as represented by the Buck1_mode waveforms. Buck1_clk_req and En_DPLL are also de-asserted at time t1. As a result of En_DPLL being de-asserted, the DPLL 102 is disabled and Clk_dco stops at time t2. Later, at time t3, the PWM mode and the PFM mode signals (the Buck2_mode waveforms) related to the second buck converter 306B transition such that the PWM mode signal goes from low-to-high and where the PFM mode signal goes from high-to-low. Buck2_clk_req and En_DPLL are also asserted at t3. As a result of En_DPLL being asserted, the DPLL 102 is enabled and Clk_dco starts immediately at t3. In the proposed DPLL embodiments, the frequency of Clk_dco upon restarting is based on a value maintained by the DPLL's loop filter during a low power mode (e.g., from t2 to t3 in FIG. 4). In this manner, the proposed DPLL embodiments achieve the design goals of being efficient (at least some loop components are turned off), being able to restart immediately after a low power mode, and providing an accurate Clk_dco signal upon restart.

Figure 5:
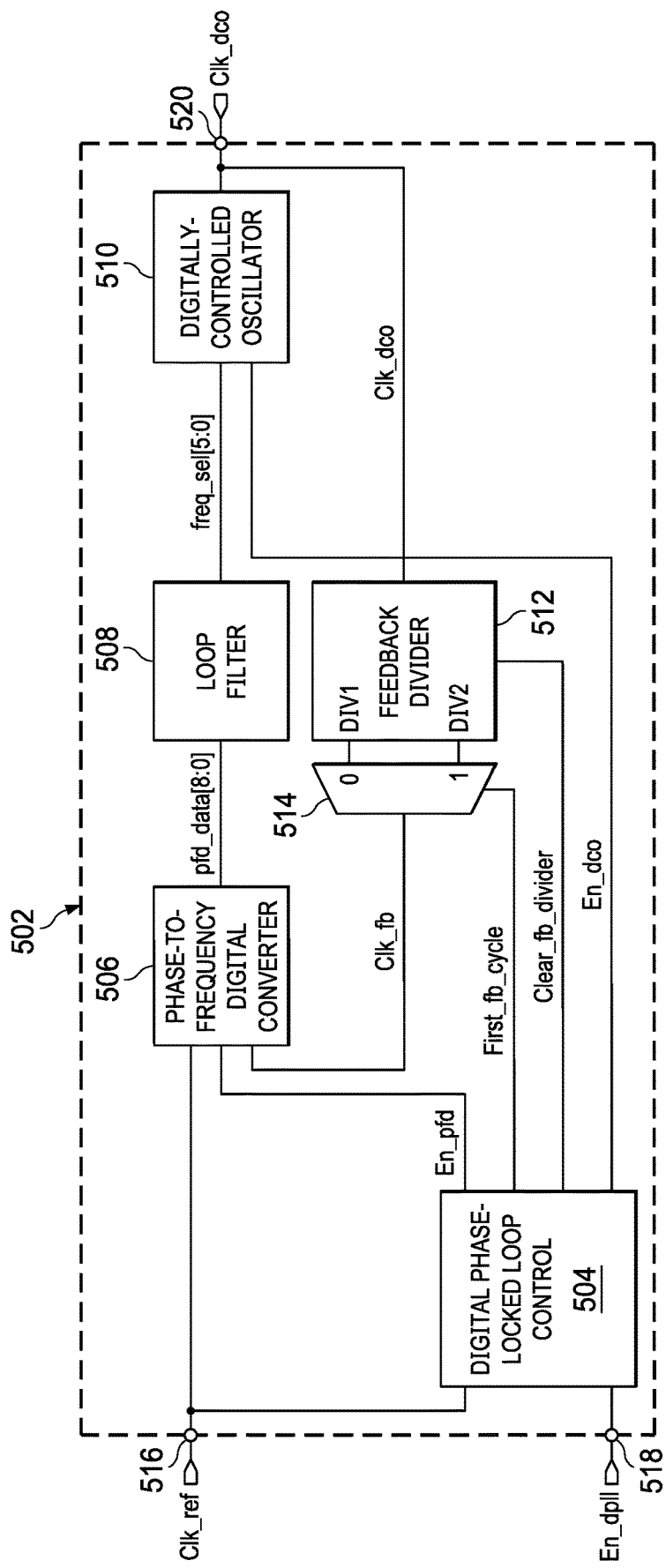
FIG. 5 is a block diagram showing a digital phase-locked loop (DPLL) in accordance with an example embodiment.

FIG. 5 is a block diagram showing a DPLL 502 (an example of the DPLL 102 in FIGS. 1 and 3) in accordance with an example embodiment. As shown, the DPLL 502 includes a phase-frequency digital converter 506 configured to receive Clk_ref via a reference clock node 516. In operation, the phase-frequency digital converter 506 measures phase error between Clk_ref and Clk_fb and converts the time difference to a digital signal (Pdf_data[8:0]).

As shown, Pdf_data[8:0] output from the phase-frequency digital converter 506 is provided to a loop filter 508. When the DPLL 502 is disabled, the loop filter 508 is frozen (e.g., loop filter flip flops are used to store a frequency value such as freq_sel[5:0] described herein) to maintain a settled frequency value. The output of the loop filter is provided to a DCO 510. In some example embodiments, the DCO 510 is implemented using digital buffers and is able to start up immediately to the frequency value (e.g., freq_sel[5:0] in FIG. 5) defined by the loop filter 508.

As shown, Clk_dco is output from the DPLL 502 to output node 520 and also provided to a feedback (FB) divider 512. The FB divider 512 provides two different outputs (e.g., DIV1 and DIV2) to a multiplexer 514, where the control signal (First_fb_cycle) for the multiplexer 514 is provided by a DPLL control circuit 504 (an example of the mode control circuit 110 in FIG. 1). The output (Clk_fb) of the multiplexer 514 is provided by either the DIV1 or DIV2 outputs of the feedback divider 512 depending on the value of First_fb_cycle. Clk_fb is input to the phase-frequency digital converter 506. The DPLL control circuit 504 also provides an enable signal (En_pfd) to the phase-frequency digital converter 506, an enable signal (En_dco) to the DCO 510, and a clear signal (Clear_fb_divider) to the FB divider 512. In the example embodiment of FIG. 5, the phase-frequency digital converter 506, the loop filter 508, the DCO 510, the divider 512, and the multiplexer 514 are examples of components included in the loop 112.

As shown, the DPLL control circuit 504 receives En_DPLL from an enable node 518 and Clk_ref from the reference clock node 516. When the DPLL control circuit 504 receives an asserted En_DPLL, the DPLL control circuit 504 asserts En_dco to enable the DCO 510. When the DPLL control circuit 504 detects a rising edge for Clk_ref, the DPLL control circuit 504 asserts En_pfd to enable the phase-frequency digital converter 506. If the DPLL 502 is being started for the first time, the DPLL control circuit 504 asserts First_fb_cycle to the multiplexer 514, which results in divider value DIV2 (e.g., 45) being used to provide Clk_fb (e.g., Clk_fb=Clk_dco/45 when DIV2 is selected) to the phase-frequency digital converter 506, where DIV2 compensates for delay caused by the DPLL control circuit 504. After the first feedback clock cycle, First_fb_cycle is de-asserted, which results in another divider value DIV1 (e.g., 48) being used to provide Clk_fb (e.g., Clk_fb=Clk_dco/48 when DIV1 is selected) to the phase-frequency digital converter 506, where DIV1 results in a lower Clk_fb frequency relative to DIV2. As needed, the DPLL control circuit 504 asserts Clear_fb_divider to the FB divider 512 to clear the state of the FB divider 512.

When the DPLL control circuit 504 receives a de-asserted En_DPLL, then En_pfd and En_dco are de-asserted to turn off the phase-frequency digital converter 506 and the DCO 510 and transition to a low power mode. The DPLL 502 stays in the low power mode until En_DPLL is asserted again, resulting in the DPLL 502 restarting. Upon restart, the DPLL control circuit 504 asserts En_dco to enable the DCO 510 immediately in response to En_DPLL being asserted. Once enabled, the DCO 510 outputs Clk_dco based on the value maintained by the loop filter 508 until the next rising edge of Clk_ref is detected. The DPLL control circuit 504 also asserts En_pfd to enable the phase-frequency digital converter 506 once the next rising edge of Clk_ref is detected after assertion of En_DPLL restarts the DPLL 502. For the first feedback clock cycle upon restart of the phase-frequency digital converter 506, the DPLL control circuit 504 asserts First_fb_cycle to the multiplexer 514, which results in DIV2 (e.g., 45) being used to provide Clk_fb to the phase-frequency digital converter 506, where DIV2 compensates for delay caused by the DPLL control circuit 504. After the first feedback clock cycle, First_fb_cycle is de-asserted, which results in DIV1 (e.g., 48) being used to provide Clk_fb to the phase-frequency digital converter 506, where DIV1 results in a lower Clk_fb frequency relative to DIV2.

To summarize, in some example embodiments, the assertion of En_DPLL signal generates the sequence: 1) En_Dco is asserted immediately and the DCO 510 starts to generate Clk_dco, 2) En_pfd remains de-asserted and the feedback divider 512 remains cleared until the rising edge of Clk_ref is detected; 3) the loop filter maintains the last value before transitioning to the low power mode because the phase-frequency digital converter 506 is disabled; 4) when the rising edge of Clk_ref is detected (three DCO clock cycles after the rising edge), En_pfd is asserted and the feedback divider 512 starts to count Clk_dco clock cycles; and 5) the first feedback clock cycle outputs Clk_fb based on DIV2 which compensates for the three DCO clock cycles delay caused by the synchronization of Clk_ref. In other example embodiments, the delay and compensation related to synchronization of Clk_ref varies accordingly to the clock rate in use.

In the example embodiment of FIG. 5, the frequency of Clk_dco upon restart is based on a value acquired during the normal mode and subsequently maintained by the loop filter 508 during the low power mode. With the topology of the DPLL 502, the design goals of being efficient (at least the phase-frequency digital converter 506 and the DCO 510 are turned off in the low power mode), being able to restart immediately after a low power mode, and providing an accurate Clk_dco signal upon restart are achieved.

Figure 6A:
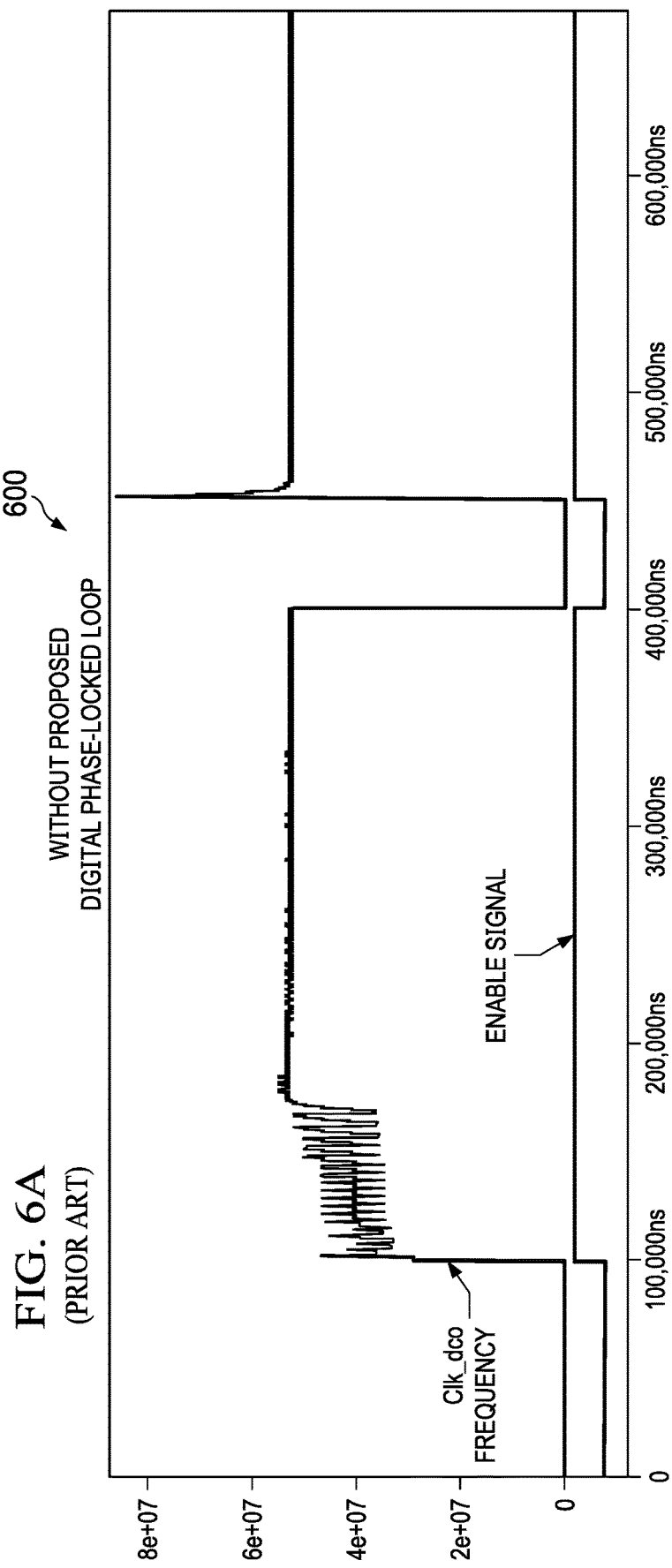
FIG. 6A is a timing diagram showing waveforms in accordance with conventional approaches.

FIG. 6A is a timing diagram 600 showing waveforms in accordance with conventional approaches. In the timing diagram 600, disabling and restart of a DPLL without the proposed topology causes significant Clk_dco frequency error (overshoot).

FIG. 6B is a timing diagram 610 showing waveforms in accordance with an example embodiment. In the timing diagram 610, disabling and restart of a DPLL with the proposed topology (e.g., the DPLL 502 in FIG. 5) results in Clk_dco being at a target frequency immediately (within one DCO clock period) without overshoot or undershoot.

Figure 7:
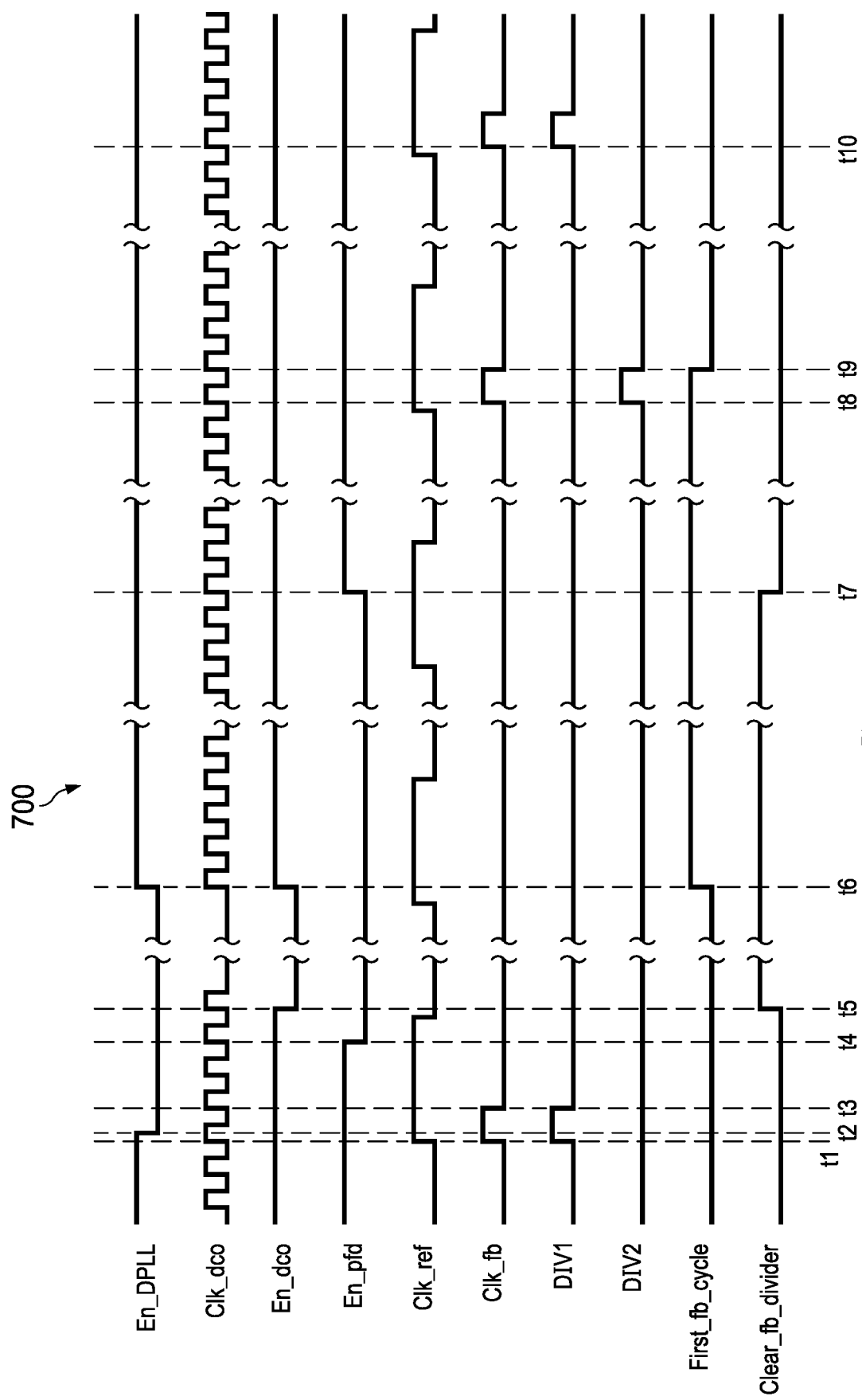
FIG. 7 is a timing diagram showing waveforms in accordance with an example embodiment.

FIG. 7 is a timing diagram 700 showing waveforms in accordance with an example embodiment. In the timing diagram 700, waveforms for En_DPLL, En_dco, En_pfd, Clk_ref, Clk_fb, DIV1, DIV2, First_fb_cycle, and Clear_fb_divider (see e.g., FIG. 5) are represented. At time t1, a DPLL (the DPLL 502) is still in normal mode such that assertion of Clk_ref, results in assertion of DIV1 and Clk_fb. In other words, the DPLL is locked before En_DPLL is de-asserted. At t2, En_DPLL is de-asserted, transitioning the DPLL from the normal mode to a low power mode. In the low power mode, once Clk_fb and DIV1 are de-asserted at t3, these signals stay de-asserted until En_DPLL is asserted again. The result of En_DPLL being de-asserted at t2 is that En_pfd is de-asserted at time t4, and En_dco is de-asserted at t5. Also, Clear_fb_divider is asserted at t5, which clears the FB divider 512. Also, Clk_dco stops after t5 even if Clk_ref is available.

Later, at time t6, En_DPLL is asserted (e.g., the DPLL 502 restarts), resulting in En_dco and First_fb_cycle being asserted. At time t7, En_pfd is asserted and Clear_fb_divider is de-asserted. At time t8, DIV2 is asserted, resulting in Clk_fb being asserted, where DIV2 accounts for control circuit delay upon restart of a DPLL. At t9, First_fb_cycle is de-asserted such that DIV1 determines Clk_fb at t10. In some example embodiments, DIV1 and Clk_fb are asserted once every 48 rising edges of Clk_dco during the normal mode after the first feedback clock cycle is complete. At time t10, Clk_ref is asserted, resulting in assertion of DIV1 and Clk_fb during normal mode operations.

As represented in the timing diagram 700, the phase and frequency of the DPLL 502 are locked after startup at t1. As represented at t4 and t5, the phase-frequency digital converter 506 (PFD) is turned off, which freezes the loop filter. After the loop filter is frozen, the FB divider 512 is cleared and the DCO 510 is turned off. At t6, the DPLL 502 is restarted, resulting in start-up of the DCO 510 immediately to the previously settled frequency. At t7, the rising edge of Clk_ref is detected, the phase-frequency digital converter 506 is enabled, and the first feedback clock cycle starts counting. At t8, the first feedback clock cycle after restart corresponds to DIV2 and is three clock cycles shorter (e.g., DIV1=48 and DIV2=45). With the proposed DPLL, the phase error is less than one Clk_dco period due to synchronization and smaller divider value. At t10, the nominal divider value, DIV1 (e.g., 48) and Clk_fb are asserted in response to Clk_ref going high, where the phase and frequency are locked immediately after restart to generate the same frequency as Clk_ref until Clk_ref synchronization occurs. In some systems that implement some example embodiments, Clk_ref may be turned off to save power. In such systems, the DPLL can be restarted and generate the same frequency (Clk_dco) without the reference clock (e.g., by using another control signal gated with Clk_ref).

Figure 8:
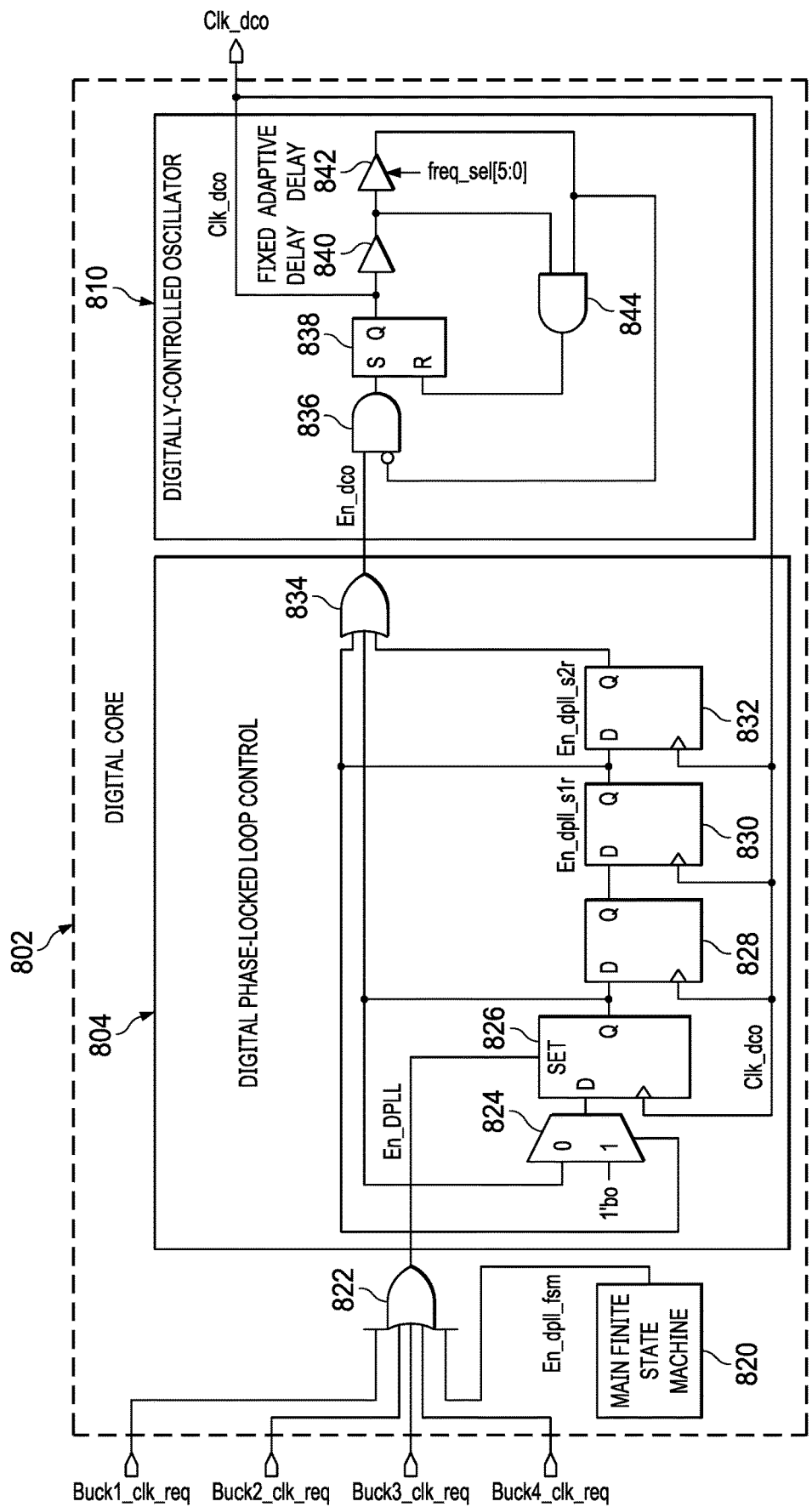
FIG. 8 is a schematic diagram showing a digital core for a DPLL in accordance with an example embodiment.

FIG. 8 is a schematic diagram showing a digital core 802 for a DPLL (e.g., the DPLL 502 in FIG. 5) in accordance with an example embodiment. As shown, the digital core 802 includes a main finite state machine (FSM) 820 configured to provide a control signal (En_dpll_fsm) to an OR gate 822. The OR gate 822 is also configured to receive control signals (e.g., Buck1_clk_req, Buck2_clk_req, Buck3_clk_req, Buck4_clk_req) from different clock domains. The output of the OR gate 822 is En_DPLL, such that assertion of any of the inputs to the OR gate 822 causes En_DPLL to be asserted. In FIG. 8, the main FSM 820 and the OR gate 822 are an example of the control logic 108 in FIGS. 1 and 3.

As shown, the digital core 802 also includes a DPLL control circuit 804 (such as the mode control circuit 110 in FIG. 1 and the DPLL control circuit 504 in FIG. 5). The DPLL control circuit 804 includes a multiplexer 824, whose output is coupled to a plurality of D flip flops 826, 828, 830, 832 in series, which are clocked by Clk_dco. The D flip flop 826 also has a SET input which asserts the output of the D flip flop 826 asynchronously to keep the output high while En_DPLL is asserted. The output of the D latches 826, 830, 832 is coupled to an OR gate 834. The rising edge of the En_DPLL signal enables the DCO 810 immediately. As needed, the DCO 810 is turned off synchronously with Clk_dco. The output of the OR gate 834 is En_dco, which is provided to a non-inverted input of an AND gate 836. More specifically, the rising edge of En_dco enables the digital ring oscillator (formed by components 836, 838, 840, 842 and 844 in FIG. 8) and the DCO 810 starts to generate the clock instantly with a target frequency.

The output of the AND gate 836 is provided to an set-reset (SR) latch 838. The output of the SR latch 838 is provided to a fixed delay circuit 840. The output of the fixed delay circuit 840 is coupled to an adaptive delay circuit 842. The output of the adaptable delay circuit 842 is a function of the output of the fixed delay circuit 840 and the adaptable delay circuit 842 via the freq_sel[5:0] signal. The outputs of the fixed delay circuit 840 and the adaptive delay circuit 842 are input to an AND gate 844, where the AND date 844 is provided to the reset node of the SR latch 838. The output of the adaptive delay circuit 842 is also provided to an inverted input of the AND gate 836. The output of the SR latch 838 is Clk_dco. With the digital core 802, a clock domain is able to wake up the DPLL clock immediately with only the delays of the combinational logic (e.g., when a VOUT comparator trigger such as a PFM pulse is generated or a load transient is detected).

Figure 9:
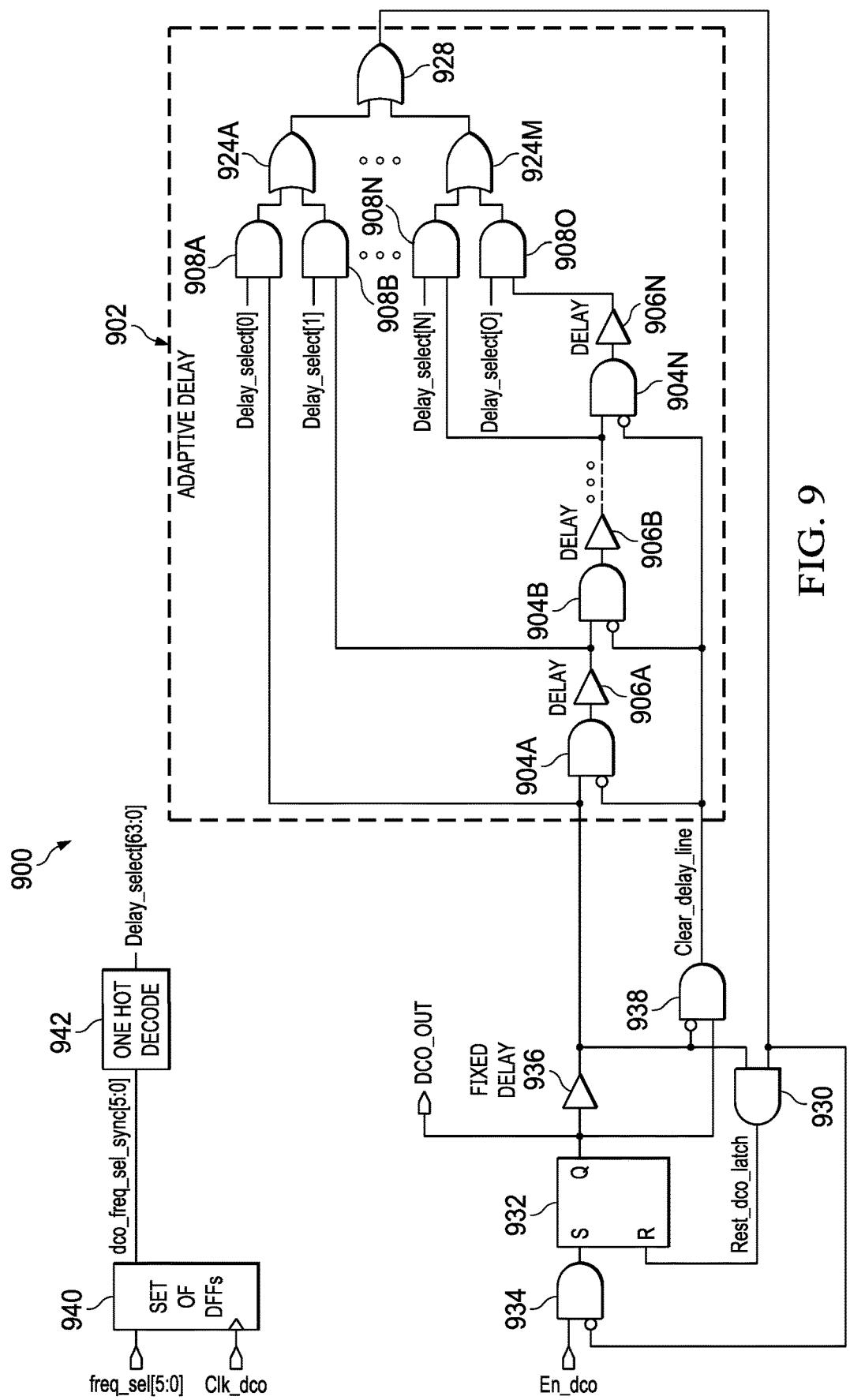
FIG. 9 is a schematic diagram showing a digitally-controlled oscillator (DCO) for a DPLL in accordance with an example embodiment.

FIG. 9 is a schematic diagram showing a DCO 900 for a DPLL (an example of the DPLL 502 in FIG. 2) in accordance with an example embodiment. As shown, the DCO 900 includes a set of D flip flops 940 (e.g., 6 D flip flops or "DFFs"). In FIG. 9, the input to the set of D lip flops 940 is freq_sel [5:0] (also 6 bits wide), where freq_sel[0] goes to the D input of a first DFF of the set of D flip flops 940 with an output dco_freq_sel_sync[0], where freq_sel[1] goes to the D input of a second DFF of the set of D flip flops 940 with an output dco_freq_sel_sync[1], and so on. All the clock inputs for the set of D flip flops 940 are connected to Clk_dco and are therefore updated at the same time. Thus, the output from the set of D flip flops 940 is updated when the rising edge of the clock input occurs. In the example of FIG. 9, the set of D flip flops 940 form a digital bus (dco_freq_sel_sync[5:0]) to output a synchronized frequency selection to a one hot decode circuit 942, where the output of the one hot decode circuit 942 is a control signal (Delay_select[63:0]).

The DCO 900 also includes an AND gate 934 with a non-inverted input configured to receive En_dco and with an inverted input configured to receive an output of an adaptive delay circuit 902 (an example of the adaptive delay circuit 842 in FIG. 8). The output of the AND gate 934 is coupled to the S input of an SR latch 932. The output of the SR latch 932 is input to the fixed delay circuit 936 (an example of the fixed delay circuit 840). The output of the fixed delay circuit 936 is coupled to one of the inputs of an AND gate 930. The other input of the AND gate 930 is coupled to the output of the adaptive delay circuit 902. The output of the AND gate 930 is a control signal (Reset_dco_latch) coupled to the R input of the SR latch 932. The output of the SR latch 932 is also coupled to an AND gate 938 with an inverted input coupled to the output of the fixed delay circuit 936. The non-inverted input of the AND gate 938 is a DCO_OUT signal (e.g., Clk_dco) so that the rising edge of En_dco results in a first clock pulse immediately.

As shown, the adaptive delay circuit 902 includes an AND gate 904A with a non-inverted input coupled to the output of the fixed delay circuit 936. The inverted input of the AND gate 904A is coupled to an output of the AND gate 938. The output of the AND gate 904A is coupled to a delay buffer 906A. The output of the delay buffer 906A is coupled to the non-inverted input of an AND gate 904B, where the inverted input of the AND gate 904B is coupled to the output of the AND gate 938. The output of the AND gate 904B is coupled to another delay buffer 906B. The output of the delay buffer 906B is coupled to a subsequent AND gate and so on up to AND gate 904N and delay buffer 906N.

The outputs of the first delay circuit 936 and the delay buffer 906A-906N are coupled to respective AND gates 908A-908O. The AND gates 908A-908O also receive respective delay select signals (Delay_select[0]-Delay_select[O]). The outputs of the AND gates 908A-908O are provided to OR gates 924A-924M and 928, where the output of the OR gate 928 is the output of the adaptive delay circuit 902. With the DCO 900, Clk_dco (DCO_OUT in FIG. 9) is available immediately upon assertion of the En_dco signal. Upon restart, the DCO 900 is able to provide Clk_dco with an accurate frequency using a value (e.g., freq_sel[5:0]) maintained by a loop filter (e.g., the loop filter 508 in FIG. 5) during a low power mode and available upon restart of the related DPLL. With the DCO 900, the set of D flip flops 940 are used to synchronize freq_sel[5:0] to the rising edge of Clk_dco. At that time, the Clear delay_line signal (output from AND gate 938) is high and it is safe to change Delay_select. If Delay_select were to be changed when part of the delay line is '1' and other parts '0', the output of adaptive delay line 902 could glitch and break up the operation of the DCO 900.

In some example embodiments, a system (e.g., the system 100 in FIG. 1, or the system 300 in FIG. 3) includes a DPLL (e.g., the DPLL 102 in FIGS. 1 and 3, or the DPLL 502 in FIG. 5) having a loop filter (e.g., the loop filter 508 in FIG. 5) and a DCO (e.g., the DCO 510 in FIG. 5, the DCO 810 in FIG. 8, or the DCO 900 in FIG. 9). The system also includes a clock generator (e.g., the clock generator 104 in FIGS. 1 and 3) and a plurality of clock domains (e.g., the clock domains 106A-106N in FIG. 1, the first and second buck converters 306A and 306B) coupled to the clock generator. The DPLL is configured to transition between a low power mode and a normal mode, wherein the loop filter is configured to maintain its value (freq_sel[5:0] in FIG. 5, or Delay_select[0]-Delay_select[O] in FIG. 9) after the DPLL transitions from the normal mode to the low power mode, and wherein the DCO is configured to output a DCO clock signal (e.g., Clk_dco in FIGS. 1, 3, 5) based on the maintained loop filter value when the DPLL transitions from the low power mode to the normal mode.

The DPLL also includes a phase-frequency digital converter (e.g., the phase-frequency digital converter 506 in FIG. 5) coupled to an input of the loop filter. The DPLL also includes a feedback divider (e.g., FB divider 512 in FIG. 5) coupled to an output of the DCO, where the feedback divider is configured to provide different scaled versions (e.g., DIV1 and DIV2 in FIG. 5) of the DCO clock signal as a feedback clock to the phase-frequency digital converter. In some example embodiments, the phase-frequency digital converter is enabled and the feedback clock is provided to the phase-frequency digital converter upon a rising edge of a reference clock input to the DPLL being detected after the DPLL transitions from the low power mode to the normal mode.

In some example embodiments, the DPLL includes a multiplexer (e.g., the multiplexer 514 in FIG. 5) coupled to outputs of the feedback divider, wherein the multiplexer is configured to forward one of a first scaled version (e.g., DIV2 in FIG. 5) of the output of the DCO and a second scaled version (e.g., DIV1 in FIG. 5) of the DCO clock signal to the phase-frequency digital converter based on a feedback control signal (e.g., First_fb_cycle in FIG. 5). In some example embodiments, the phase-frequency digital converter is configured to measure a phase error between the feedback clock and the reference clock at a next rising edge of the reference clock subsequent to the phase-frequency digital converter being enabled.

In some example embodiments, the DPLL also includes a control circuit (e.g., the DPLL control circuit 504 in FIG. 5) configured to provide the feedback control signal, wherein the feedback control signal is used to select the first scaled version of the DCO clock signal for a first feedback clock cycle of the normal mode to account for delay of the control circuit when transitioning from the low power mode to the normal mode, and wherein the feedback control signal is used to select the second scaled version of the DCO clock signal after the first feedback clock cycle of the normal mode. In some example embodiments, the control circuit is configured to assert a clear divider signal to the feedback divider in response to the DPLL enable signal being previously de-asserted (a few clock cycles before).

In some example embodiments, the control circuit is configured to provide: the feedback control signal to the multiplexer and an enable signal (e.g., En_pfd in FIG. 5) to the phase-frequency digital converter, the enable signal to the phase-frequency digital converter remaining de-asserted during the low power mode, the feedback divider remaining cleared during the low power mode, and the loop filter maintaining its value during the low power mode. In some example embodiments, the control circuit is configured to provide an enable signal (e.g., En_dco in FIG. 5) to the DCO, where the enable signal to the DCO is asserted immediately upon the transition from the low power mode to the normal mode resulting in the DCO outputting the DCO clock signal based on the maintained loop filter value until the reference clock is received.

In some examples, the system includes control logic (e.g., the control logic 108 in FIGS. 1 and 3, or Main FSM 820 and OR gate 822 in FIG. 8) coupled between the DPLL and the clock domains, wherein the control logic is configured to assert a DPLL enable signal (e.g., En_DPLL in FIG. 1, 3, or 8) in response to a clock request signal from any of the clock domains. The DPLL enable signal causes the control circuit to assert the enable signal to the DCO immediately and to assert the enable signal to the phase-frequency digital converter upon detection of the rising edge of the reference clock. In some example embodiments, the DPLL is configured to transition from the normal mode to the low power mode based on a predetermined schedule. In some example embodiments, the clock domains are buck converter circuits (e.g., the first and second buck converters 306A and 306B in FIG. 3), and wherein the predetermined schedule is based on a switching rate of each buck converter circuit.

In some example embodiments, a DPLL circuit includes a reference clock node (e.g., the reference clock node 516 in FIG. 5), an enable node (e.g., the enable node 518 in FIG. 5), and an output node (e.g., the output node 520 in FIG. 5). The DPLL circuit also includes a phase-frequency digital converter (e.g., the phase-frequency digital converter 506 in FIG. 5) coupled to the reference clock node. The DPLL circuit also includes a loop filter (e.g., the loop filter 508 in FIG. 5) coupled to an output of the phase-frequency digital converter. The DPLL circuit also includes a DCO (e.g., the DCO 510 in FIG. 5, the DCO 810 in FIG. 8, or the DCO 900 in FIG. 9) coupled to an output of the loop filter. The DPLL circuit also includes a control circuit (e.g., the DPLL control circuit 504 in FIG. 5) coupled to the phase-frequency digital converter and the DCO. The control circuit is configured to selectively enable and disable the phase-frequency digital converter and the DCO in response to DPLL transitions between a normal mode and a low power mode. The DCO is configured to output a DCO clock signal based on a value maintained by the loop filter in response to the phase-frequency digital converter and the DCO being enabled for a first interval corresponding to the normal mode and then being disabled for a second interval corresponding to the low power mode.

In some example embodiments, the DPLL circuit also includes feedback divider (e.g., the FB divider 514 in FIG. 5) with an input coupled to an output (e.g., Clk_dco in FIG. 5) of the DCO and with multiple outputs (e.g., resulting from DIV1 or DIV2 in FIG. 5) configured to provide different scaled versions of the DCO clock signal. In some example embodiments, the DPLL circuit also includes a multiplexer (e.g., the multiplexer 514 in FIG. 5) coupled to the outputs of the feedback divider and to the digital-to-phase converter, and wherein the control circuit is configured to provide a control signal (e.g., First_fb_cycle in FIG. 5) to the feedback divider to manage forwarding of a first scaled version of the DCO clock signal for a first feedback clock cycle to account for delay of the control circuit and forwarding of a second scaled version of the DCO clock signal after the first feedback clock cycle. that directs the multiplexer to forward a first scaled version (e.g., DIV2 in FIG. 5) of the output of the DCO for a first feedback clock cycle to account for delay of the control circuit. In some example embodiments, the control circuit is configured to provide a control signal (e.g., First_fb_cycle in FIG. 5) that directs the multiplexer to forward a second scaled version (e.g., DIV1 in FIG. 5) of the output of the DCO signal after the first feedback clock cycle.

In some example embodiments, the control circuit is configured to assert an enable signal (e.g., En_dco) to the DCO, the enable signal to the DCO being asserted immediately in response to a transition to the normal mode. In some example embodiments, the control circuit is configured to assert an enable signal (e.g., En_pfd in FIG. 5) to the phase-frequency digital converter in response to a rising edge of a reference clock received via the reference clock node being detected after transition to the normal mode, such that the phase-frequency digital converter measures phase error between the reference clock and the feedback clock upon a next rising edge of the reference clock rising edge after the detected rising edge.

In some example embodiments, the DCO is configured to output a DCO clock signal to the output node based on a value maintained by the loop filter in response to the DPLL being enabled in the normal mode, disabled in the low power mode, and enabled again in a subsequent normal mode. In some example embodiments, the DCO comprises an adaptive delay line (e.g., the adaptive delay line 842 in FIG. 8, or the adaptive delay line 902 in FIG. 9) that responds immediately to an enable signal from the control circuit. In some example embodiments, the DPLL circuit corresponds to an integrated circuit (IC).

In some example embodiments, the control circuit is configured to enable the phase-frequency digital converter and the DCO during a first time interval (e.g., before t1 in FIG. 4) associated with a normal mode, wherein the control circuit is configured to disable the phase-frequency digital converter and the DCO during a second time interval (e.g., between t1 and t2 in FIG. 4) associated with a low power mode. In some example embodiments, En_pfd is de-asserted on the third rising edge of Clk_dco after En_DPLL is de-asserted. Also, En_dco is de-asserted on the fourth rising edge of Clk_dco after En_DPLL goes low as represented in FIG. 7). Also, the control circuit is configured to enable the phase-frequency digital converter and the DCO during a third time interval (e.g., after t3 in FIG. 4) associated with the normal mode, wherein the loop filter is configured to maintain its value during the second time interval, and wherein the DCO, in the third time interval, is configured to immediately output a clock signal based on the value maintained by the loop filter during the second time interval.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ."

The term "couple" is used throughout the specification. The term may cover connections, communications, or signal paths that enable a functional relationship consistent with the description of the present disclosure. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

The above discussion is meant to be illustrative of the principles and various embodiments of the present invention. Numerous variations and modifications will become apparent to those skilled in the art once the above disclosure is fully appreciated.

What is claimed is:

1. A system, comprising:
 a digital phase-locked loop (DPLL) having:
  a loop filter; and
  a digitally-controlled oscillator (DCO);
 a clock generator coupled to an output of the DPLL; and
 a plurality of clock domains coupled to the clock generator,
 wherein the DPLL is configured to transition between a low power mode and a normal mode, wherein the loop filter is configured to maintain its value after the DPLL transitions from the normal mode to the low power mode, and wherein the DCO is configured to output a DCO clock signal based on the maintained loop filter value when the DPLL transitions from the low power mode to the normal mode.

2. The system of claim 1, wherein the DPLL further comprises:
 a phase-frequency digital converter coupled to an input of the loop filter; and
 a feedback divider coupled to an output of the DCO, wherein the feedback divider is configured to provide different scaled versions of the DCO clock signal as a feedback clock to the phase-frequency digital converter, wherein the phase-frequency digital converter is enabled and the feedback clock is provided to the phase-frequency digital converter upon a rising edge of a reference clock input to the DPLL being detected after the DPLL transitions from the low power mode to the normal mode.

3. The system of claim 2, wherein the rising edge of the reference clock is detected three DCO clock signal cycles after the rising edge of the reference clock.

4. The system of claim 2, wherein the DPLL further comprises:
 a multiplexer coupled to outputs of the feedback divider, wherein the multiplexer is configured to forward one of a first scaled version of the DCO clock signal and a second scaled version of the DCO clock signal as the feedback clock to the phase-frequency digital converter based on a feedback control signal,
 wherein the phase-frequency digital converter is configured to measure a phase error between the feedback clock and the reference clock at a next rising edge of the reference clock subsequent to the phase-frequency digital converter being enabled.

5. The system of claim 4, further comprising a control circuit configured to provide the feedback control signal, wherein the feedback control signal is used to select the first scaled version of the DCO clock signal for a first feedback clock cycle of the normal mode to account for delay of the control circuit when transitioning from the low power mode to the normal mode, and wherein the feedback control signal is used to select the second scaled version of the DCO clock signal after the first feedback clock cycle of the normal mode.

6. The system of claim 4, wherein the DPLL further comprises a control circuit configured to provide:
 the feedback control signal to the multiplexer; and
 an enable signal to the phase-frequency digital converter, the enable signal to the phase-frequency digital converter remaining de-asserted during the low power mode, the feedback divider remaining cleared during the low power mode, and the loop filter maintaining its value during the low power mode.

7. The system of claim 6, wherein the control circuit is configured to provide an enable signal to the DCO, wherein the enable signal to the DCO is asserted immediately upon the transition from the low power mode to the normal mode resulting in the DCO outputting the DCO clock signal based on the maintained loop filter value until the reference clock is received.

8. The system of claim 7, further comprising control logic coupled between the DPLL and the clock domains, wherein the control logic is configured to assert a DPLL enable signal in response to a clock request signal from any of the clock domains, and wherein the DPLL enable signal causes the control circuit to assert the enable signal to the DCO immediately and to assert the enable signal to the phase-frequency digital converter upon detection of the rising edge of the reference clock.

9. The system of claim 1, wherein the DPLL is configured to transition from the normal mode to the low power mode based on a predetermined schedule.

10. The system of claim 9, wherein the clock domains are buck converter circuits, and wherein the predetermined schedule is based on a switching rate of each buck converter circuit.

11. A digital phase-locked loop (DPLL) circuit, comprising:
 a reference clock node;
 an output node;

a phase-frequency digital converter coupled to the reference clock node;
a loop filter coupled to an output of the phase-frequency digital converter;
a digitally-controlled oscillator (DCO) coupled to an output of the loop filter; and
a control circuit coupled to the phase-frequency digital converter and the DCO, wherein the control circuit is configured to enable and disable the phase-frequency digital converter and the DCO in response to transitions between a normal mode and a low power mode, and wherein the DCO is configured to output a DCO clock signal based on a value maintained by the loop filter in response to the phase-frequency digital converter and the DCO being enabled for a first interval corresponding to the normal mode and then being disabled for a second interval corresponding to the low power mode.

12. The DPLL circuit of claim 11, further comprising a feedback divider with an input coupled to an output of the DCO and with multiple outputs configured to provide different scaled versions of the DCO clock signal as a feedback clock to the phase-frequency digital converter.

13. The DPLL circuit of claim 12, wherein the control circuit is configured to provide a control signal to the feedback divider to manage forwarding of a first scaled version of the DCO clock signal for a first feedback clock cycle to account for delay of the control circuit and forwarding of a second scaled version of the DCO clock signal after the first feedback clock cycle.

14. The DPLL circuit of claim 13, wherein the control circuit is configured to assert an enable signal to the DCO, the enable signal to the DCO being asserted immediately in response to a transition to the normal mode.

15. The DPLL circuit of claim 14, wherein the control circuit is configured to assert enable signals to the phase-frequency digital converter and the feedback divider in response to a rising edge of a reference clock received via the reference clock node being detected after transition to the normal mode, such that the phase-frequency digital converter measures phase error between the reference clock and the feedback clock upon a next rising edge of the reference clock rising edge after the detected rising edge.

16. An integrated circuit, comprising:
a digital phase-locked loop (DPLL) having:
a reference clock node;
an output node;
a phase-frequency digital converter coupled to the reference clock node;
a loop filter coupled to an output of the phase-frequency digital converter;
a digitally-controlled oscillator (DCO) coupled to an output of the loop filter,
wherein the DCO is configured to output a DCO clock signal to the output node based on a value maintained by the loop filter in response to the DPLL being enabled in the normal mode, disabled in the low power mode, and enabled again in a subsequent normal mode.

17. The integrated circuit of claim 16, wherein the DPLL further comprises:
a feedback divider with an input coupled to an output of the DCO and with multiple outputs configured to provide different scaled versions of the output of the DCO as a feedback clock to the phase-frequency digital converter.

18. The integrated circuit of claim 16, wherein the control circuit is configured to assert enable signals to the phase-frequency digital converter and the DCO in response to a transition to a normal mode, and wherein the control circuit is configured to de-assert the enable signals to the phase-frequency digital converter and the DCO in response to a transition to a low power mode.

19. The integrated circuit of claim 16, wherein the DCO comprises an adaptive delay line that responds immediately to an enable signal from the control circuit.

20. The integrated circuit of claim 16, wherein control circuit is configured to enable the phase-frequency digital converter and the DCO during a first time interval associated with a normal mode, wherein the control circuit is configured to disable the phase-frequency digital converter and the DCO during a second time interval associated with a low power mode, and wherein the control circuit is configured to enable the phase-frequency digital converter and the DCO during a third time interval associated with the normal mode, wherein the loop filter is configured to maintain its value during the second time interval, and wherein the DCO, in the third time interval, is configured to immediately output a clock signal based on the value maintained by the loop filter during the second time interval.

* * * * *